US009640645B2

(12) United States Patent
Colinge et al.

(10) Patent No.: US 9,640,645 B2
(45) Date of Patent: May 2, 2017

(54) SEMICONDUCTOR DEVICE WITH SILICIDE

(71) Applicant: Taiwan Semiconductor Manufacturing Company Limited, Hsin-Chu (TW)

(72) Inventors: Jean-Pierre Colinge, Hsinchu (TW); Kuo-Cheng Ching, Zhubei (TW); Ta-Pen Guo, Cupertino, CA (US); Carlos H. Diaz, Mountain View, CA (US)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/018,737

(22) Filed: Sep. 5, 2013

(65) Prior Publication Data
US 2015/0060996 A1    Mar. 5, 2015

(51) Int. Cl.
*H01L 29/775*    (2006.01)
*H01L 29/786*    (2006.01)
(Continued)

(52) U.S. Cl.
CPC ............ *H01L 29/775* (2013.01); *B82Y 10/00* (2013.01); *B82Y 40/00* (2013.01);
(Continued)

(58) Field of Classification Search
CPC ............... H01L 21/84; H01L 29/66484; H01L 29/78642; H01L 29/775; H01L 29/413;
(Continued)

(56) References Cited

U.S. PATENT DOCUMENTS

2010/0207199 A1* 8/2010 Masuoka et al. ............. 257/329
2010/0213525 A1* 8/2010 Masuoka .......... H01L 21/82382
257/306
(Continued)

FOREIGN PATENT DOCUMENTS

CN    101494199 A    7/2009
JP    2011211127    10/2011
(Continued)

OTHER PUBLICATIONS

Sakui, et al., "A new vertical MOSFET "Vertical Logic Circuit (VLC) MOSFET" suppressing asymmetric characteristics and realizing an ultra compact and robust logic circuit", Solid-State Electronics 54 (2010) 1457-1462, Apr. 5, 2010, www.elsevier.com/locate/sse.
(Continued)

*Primary Examiner* — Joshua King
*Assistant Examiner* — Mohammed R Alam
(74) *Attorney, Agent, or Firm* — Cooper Legal Group, LLC

(57) ABSTRACT

A semiconductor device includes a first type region including a first conductivity type. The semiconductor device includes a second type region including a second conductivity type. The semiconductor device includes a channel region extending between the first type region and the second type region. The semiconductor device includes a first silicide region on a first type surface region of the first type region. The first silicide region is separated at least one of a first distance from a first type diffusion region of the first type region or a second distance from the channel region.

20 Claims, 14 Drawing Sheets

(51) Int. Cl.
*B82Y 10/00* (2011.01)
*B82Y 40/00* (2011.01)
*H01L 29/66* (2006.01)
*H01L 29/06* (2006.01)
*H01L 29/41* (2006.01)
*H01L 29/16* (2006.01)

(52) U.S. Cl.
CPC ........ *H01L 29/0676* (2013.01); *H01L 29/413* (2013.01); *H01L 29/66439* (2013.01); *H01L 29/78642* (2013.01); *H01L 29/16* (2013.01)

(58) Field of Classification Search
CPC ........... H01L 29/66439; H01L 29/0676; H01L 29/66712; H01L 29/7802; H01L 29/16; H01L 29/7781; H01L 29/778; H01L 29/7789; H01L 29/7782; H01L 29/7828; H01L 29/78687; H01L 29/161; H01L 29/165; B82Y 40/00; B82Y 10/00
USPC ................................. 257/135–136, 242, 329
See application file for complete search history.

(56) References Cited

U.S. PATENT DOCUMENTS

| | | | | |
|---|---|---|---|---|
| 2010/0213539 A1* | 8/2010 | Masuoka | ................ | H01L 21/84 257/329 |
| 2011/0303973 A1* | 12/2011 | Masuoka | .......... | H01L 21/82388 257/329 |
| 2011/0303985 A1* | 12/2011 | Masuoka et al. | ............. | 257/369 |
| 2012/0086066 A1 | 4/2012 | Kim et al. | | |
| 2012/0319201 A1 | 12/2012 | Sun et al. | | |
| 2013/0105897 A1 | 5/2013 | Bangsaruntip et al. | | |
| 2013/0307037 A1* | 11/2013 | Masuoka et al. | ............. | 257/288 |

FOREIGN PATENT DOCUMENTS

| | | |
|---|---|---|
| KR | 1020120036447 | 4/2012 |
| KR | 1020120139067 | 12/2012 |

OTHER PUBLICATIONS

Larrieu, et al., "Vertical nanowire array-based field effect transistors for ultimate scalingt†", This journal is $^a$ The Royal Society of Chemistry 2013, Nanoscale, Jan. 21, 2013, 5, 2437-2441, www.rsc.org/nanoscale.
Corresponding Korean Application, Korean Notice of Allowance dated Mar. 2, 2016, 6 pages.
Corresponding Korean Application, Korean Office action dated Oct. 1, 2015, 11 pages.
Corresponding Chinese Application 201310351553.7, Chinese Office action dated Dec. 28, 2016, 6 pages.
Corresponding Chinese Application 201410313445.5, Chinese Office action dated Jan. 3, 2017, 6 pages.

* cited by examiner

SEMICONDUCTOR DEVICE WITH SILICIDE

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques, and resulting structures, for forming a semiconductor device are provided herein.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
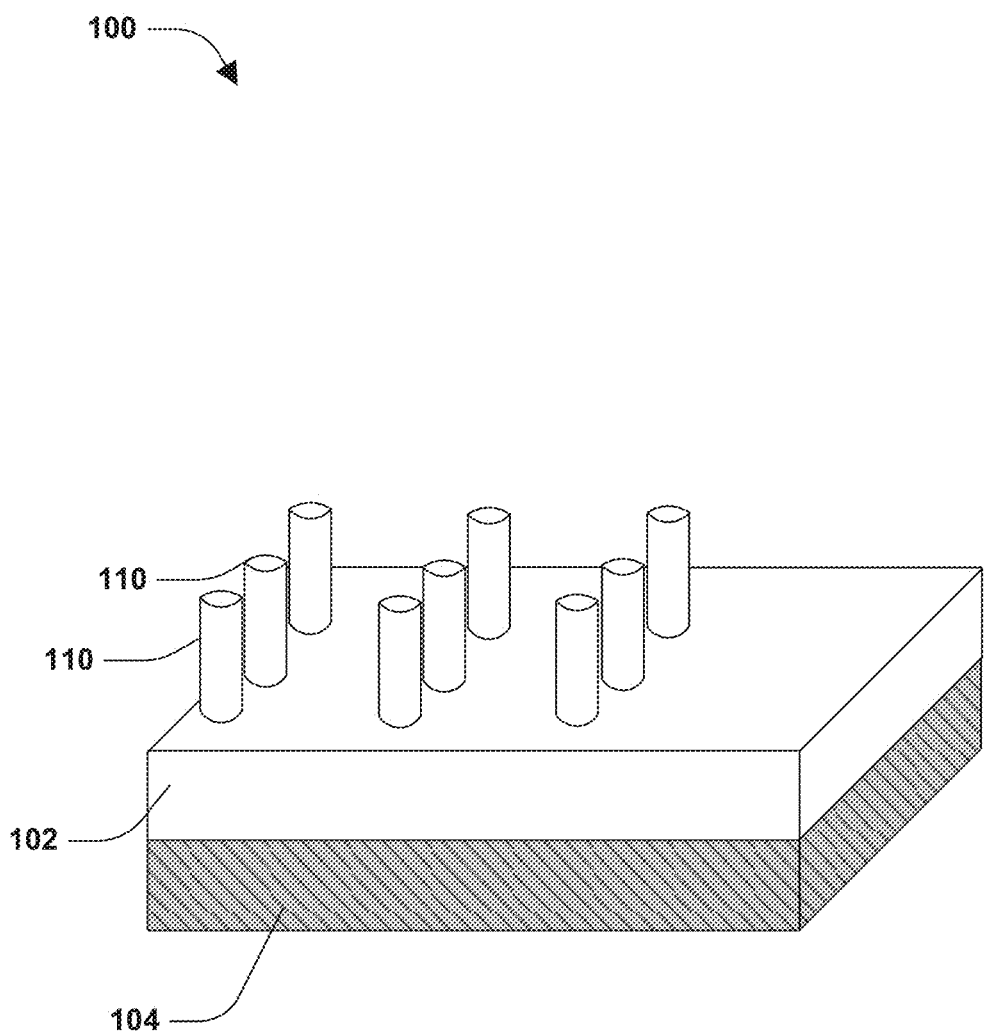
FIG. 1 illustrates at least a portion of a semiconductor device, according to an embodiment.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor device and resulting structures formed thereby are provided herein.

FIG. 1 is a perspective view illustrating at least a portion of a semiconductor device 100 according to some embodiments. In an embodiment, the semiconductor device 100 is formed upon a well region 102. According to some embodiments, the well region 102 comprises a first conductivity type. In some embodiments, the first conductivity type of the well region 102 comprises a p-type, such that the well region 102 comprises a p-well. In some embodiments, the first conductivity type of the well region 102 comprises an n-type, such that the well region 102 comprises an n-well.

According to some embodiments, the well region 102 is formed on or within a substrate region 104. The substrate region 104 comprises any number of materials, such as, for example, silicon, polysilicon, germanium, etc., alone or in combination. According to some embodiments, the substrate region 104 comprises an epitaxial layer, a silicon-on-insulator (SOI) structure, a wafer, or a die formed from a wafer, etc.

In an embodiment, the semiconductor device 100 comprises one or more nanowires 110. According to some embodiments, the nanowires 110 project from the well region 102. The nanowires 110 comprise any number of materials such as, for example, silicon, polysilicon, germanium, etc., alone or in combination.

Figure 2:
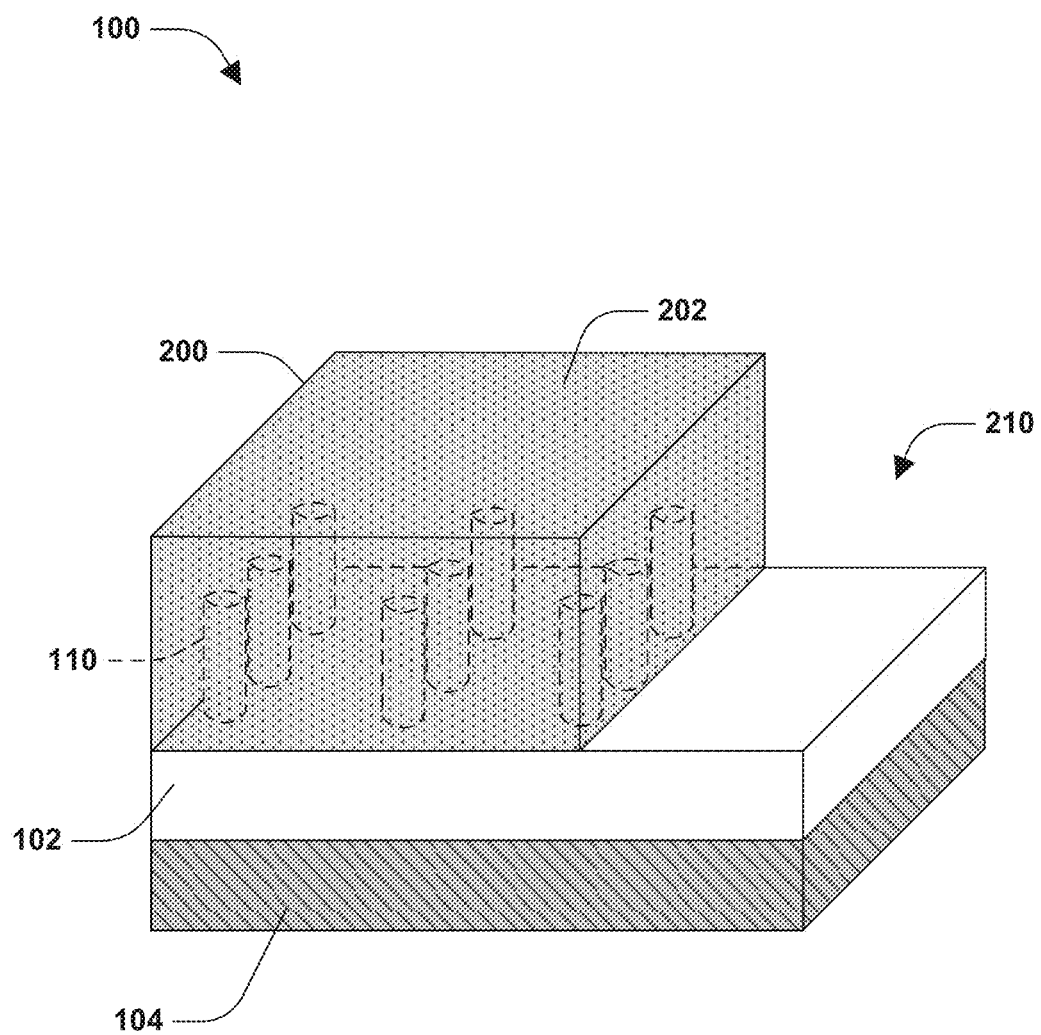
FIG. 2 illustrates a portion of a semiconductor device, according to an embodiment.

Turning now to FIG. 2, according to some embodiments, a mask region 200 is formed over the well region 102 and nanowires 110. The mask region 200 is formed in any number of ways, such as by deposition, chemical vapor deposition (CVD), or other suitable methods, for example. The mask region 200 includes any number of materials, including oxides, silicon oxide, nitrides, silicon nitride, $Si_3N_4$, etc., alone or in combination. In some embodiments, a top surface 202 of the mask region 200 is planarized, such as by a chemical mechanical polishing (CMP) process.

In an embodiment, a first recess 210 is formed in the mask region 200. In an embodiment, the first recess 210 is formed over a portion of the well region 102. In some embodiments, the first recess 210 is formed by removing a portion of the mask region 200 not covering the nanowires 110. The first recess 210 is formed in any number of ways, such as by etching the mask region 200, for example.

Figure 3:
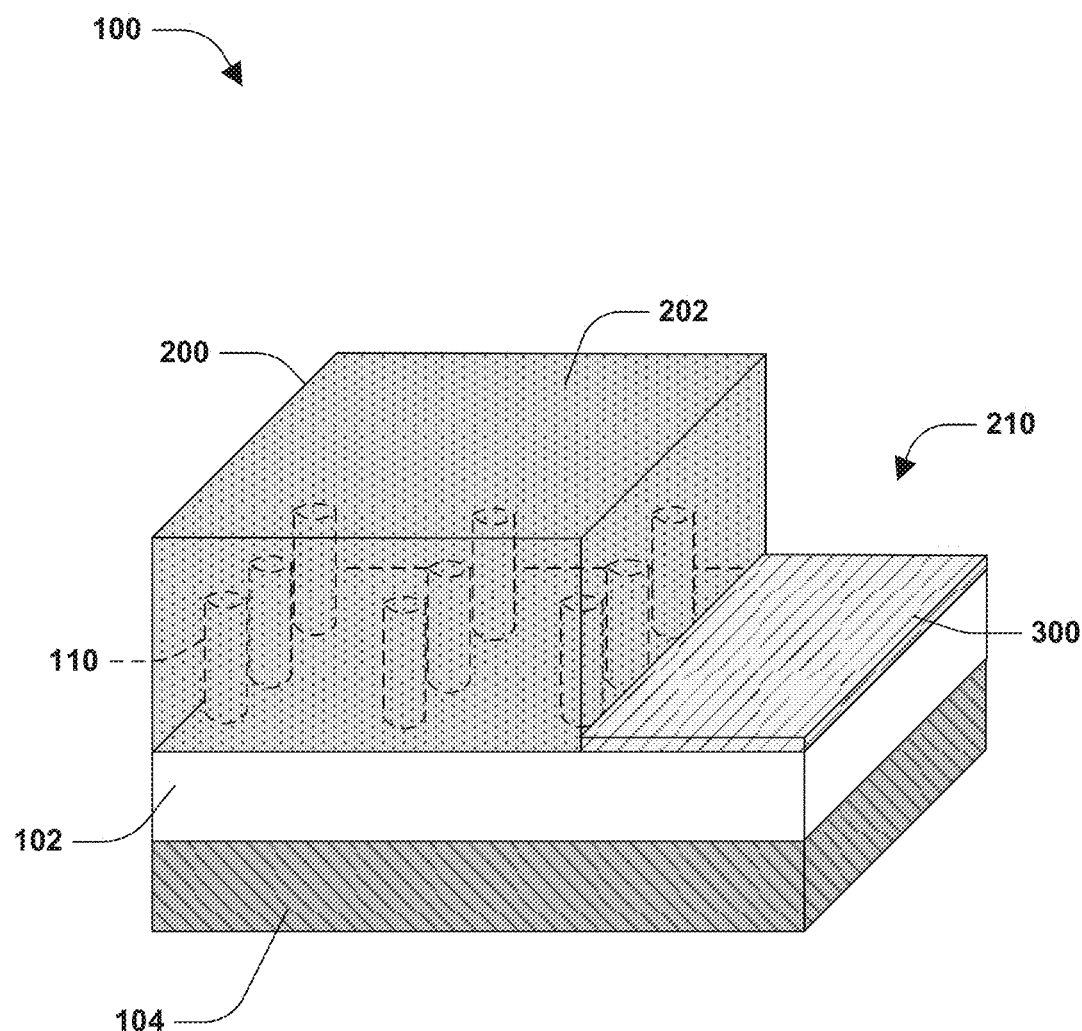
FIG. 3 illustrates a portion of a semiconductor device, according to an embodiment.

Turning to FIG. 3, in an embodiment, an isolation region 300 is formed within the first recess 210 over the well region 102. In some embodiments, the isolation region 300 comprises a shallow trench isolation (STI) region. In some embodiments, the isolation region 300 comprises a local oxidation of silicon (LOCOS) region. The isolation region 300 is formed in any number of ways, such as by deposition, oxidation, etc., for example. In some embodiments, the isolation region 300 is formed prior to formation of the nanowires 110 and thus prior to the embodiment illustrated in FIG. 1.

Figure 4:
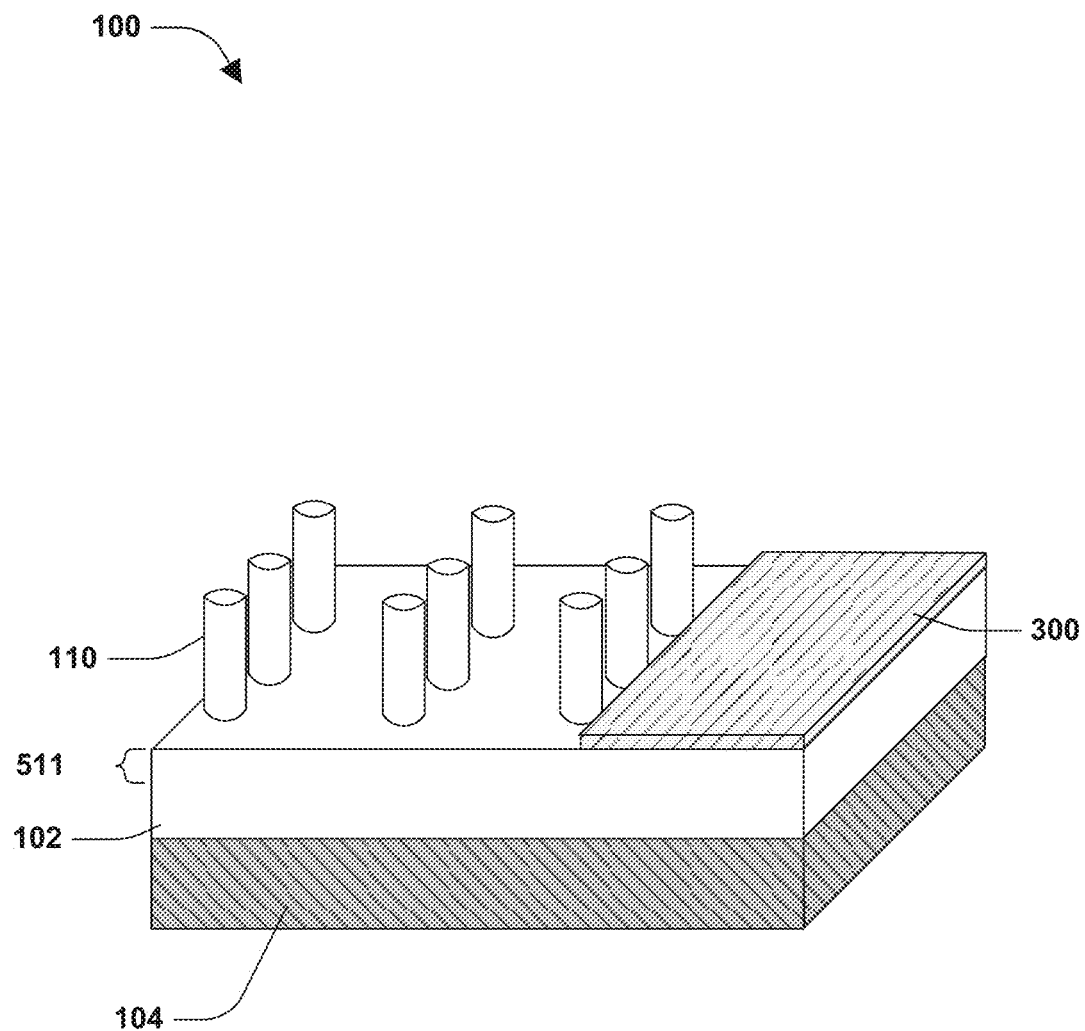
FIG. 4 illustrates a portion of a semiconductor device, according to an embodiment.

Turning to FIG. 4, in an embodiment, the mask region 200 is removed, such as by etching. In some embodiments, the etch chemistry used to etch the mask region 200 is selective enough that the isolation region 300 is not removed. In some embodiments, the nanowires 110 and well region 102 are exposed after the mask region 200 is removed.

Figure 5:
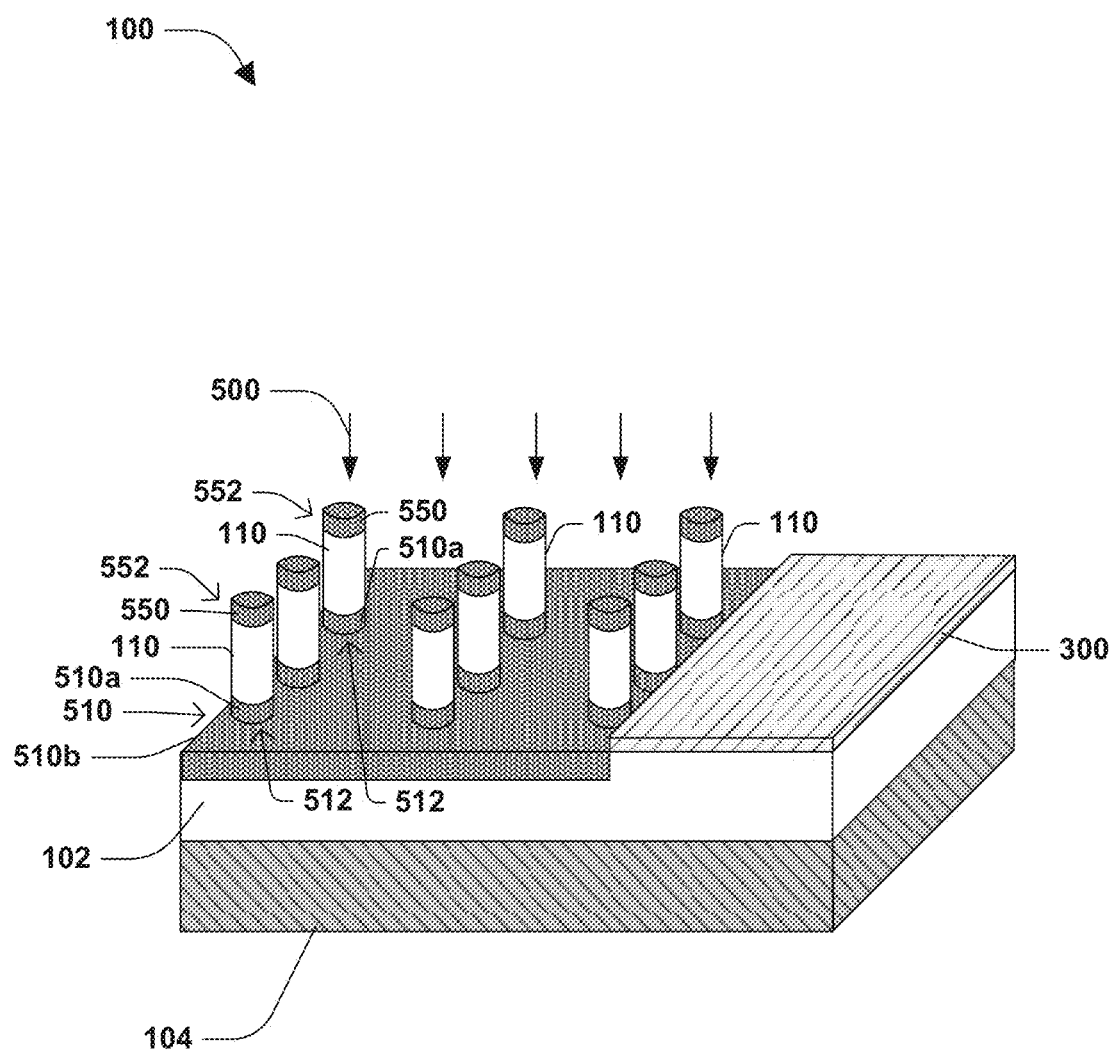
FIG. 5 illustrates forming a first type region and a second type region associated with forming a semiconductor device, according to an embodiment.

Turning to FIG. 5, in some embodiments, at least one first type region 510 is formed, such as by doping 500 the well region 102 and nanowires 110. In an embodiment, a first type region 510 comprises a first type diffusion region 510a and a first type surface region 510b. In an embodiment, the first type surface region 510b is formed by doping an upper portion 511 (illustrated in FIG. 4) of the well region 102. In an embodiment, the first type diffusion region 510a is formed by doping a first end 512 of the nanowires 110. In some embodiments, the first type diffusion region 510a at the first end 512 of the nanowires 110 is formed by diffusion from the first type surface region 510b.

According to some embodiments, the first type diffusion region 510a and first type surface region 510b comprise a first conductivity type. In some embodiments, the first conductivity type of the first type diffusion region 510a and first type surface region 510b comprise a p-type material, p+ type material, p++ type material, p-type dopants such as Boron, Gallium, Indium, etc., alone or in combination. In some embodiments, the first conductivity type of the first type diffusion region 510a and first type surface region 510b comprise an n-type material, n+ type material, n++ type material, n-type dopants such as Phosphorous, Arsenic, Antimony, etc., alone or in combination. According to some embodiments, the first type diffusion region 510a and first type surface region 510b comprise a source region. According to some embodiments, the first type diffusion region 510a and first type surface region 510b comprise a drain region.

In some embodiments, a second type region 550 is formed, such as by doping 500 a second end 552 of the nanowires 110. In some embodiments, the second type region 550 is formed at substantially the same time as the first type diffusion region 510a and first type surface region 510b are formed, such as by implantation and annealing. According to some embodiments, the second type region 550 comprises a second conductivity type. In some embodiments, the second conductivity type of the second type region 550 comprises a p-type material, p+ type material, p++ type material, p-type dopants such as Boron, Gallium, Indium, etc., alone or in combination. In some embodiments, the second conductivity type of the second type region 550 comprises an n-type material, n+ type material, n++ type material, n-type dopants such as Phosphorous, Arsenic, Antimony, etc., alone or in combination. According to some embodiments, the second type region 550 comprises a source region. According to some embodiments, the second type region 550 comprises a drain region.

According to some embodiments, the first conductivity type of the first type region 510 is the same or substantially similar to the second conductivity type of the second type region 550. In an embodiment, the first conductivity type of the first type region 510 and the second conductivity type of the second type region 550 comprise a p-type material, p+ type material, p++ type material, p-type dopants such as Boron, Gallium, Indium, etc., alone or in combination. In an embodiment, the first conductivity type of the first type region 510 and the second conductivity type of the second type region 550 comprise an n-type material, n+ type material, n++ type material, n-type dopants such as Phosphorous, Arsenic, Antimony, etc., alone or in combination.

Figure 6:
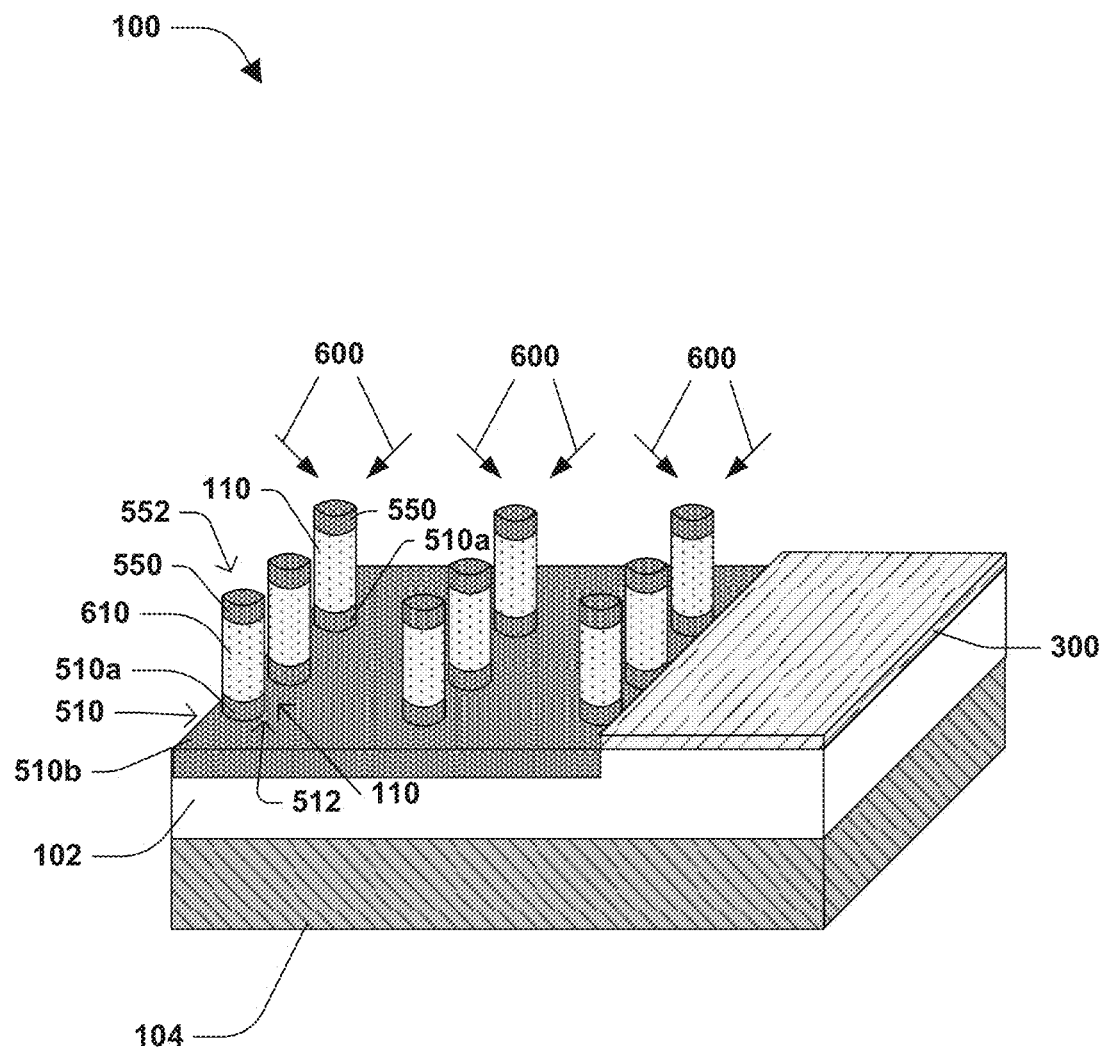
FIG. 6 illustrates forming a channel region associated with forming a semiconductor device, according to an embodiment.

Turning to FIG. 6, in some embodiments, a channel region 610 is formed, such as by doping 600 the nanowires 110. In some embodiments, the channel region 610 is formed by a tilted or angled doping process, in which the nanowires 110 are doped at a non-vertical angle. In some embodiments, the channel region 610 is formed by a vertical doping with a covering mask. In an embodiment, the covering mask is formed over the nanowires 110 while vertical doping is performed to form the channel region 610. In some embodiments, the channel region 610 extends between the first type diffusion region 510a of the first type region 510 and the second type region 550. In an embodiment, the channel region 610 is comprised within a vertical nanowire According to some embodiments, the channel region 610 comprises a third conductivity type. In some embodiments, the third conductivity type of the channel region 610 comprises a p-type material, p+ type material, p++ type material, p-type dopants such as Boron, Gallium, Indium, etc., alone or in combination. In some embodiments, the third conductivity type of the channel region 610 comprises an n-type material, n+ type material, n++ type material, n-type dopants such as Phosphorous, Arsenic, Antimony, etc., alone or in combination. In some embodiments, the third conductivity type of the channel region 610 is the same or substantially similar to the first conductivity type and the second conductivity type. In some embodiments, the third conductivity type of the channel region 610 is different from the first conductivity type and the second conductivity type. In an embodiment, the channel region 610 is undoped.

Figure 7:
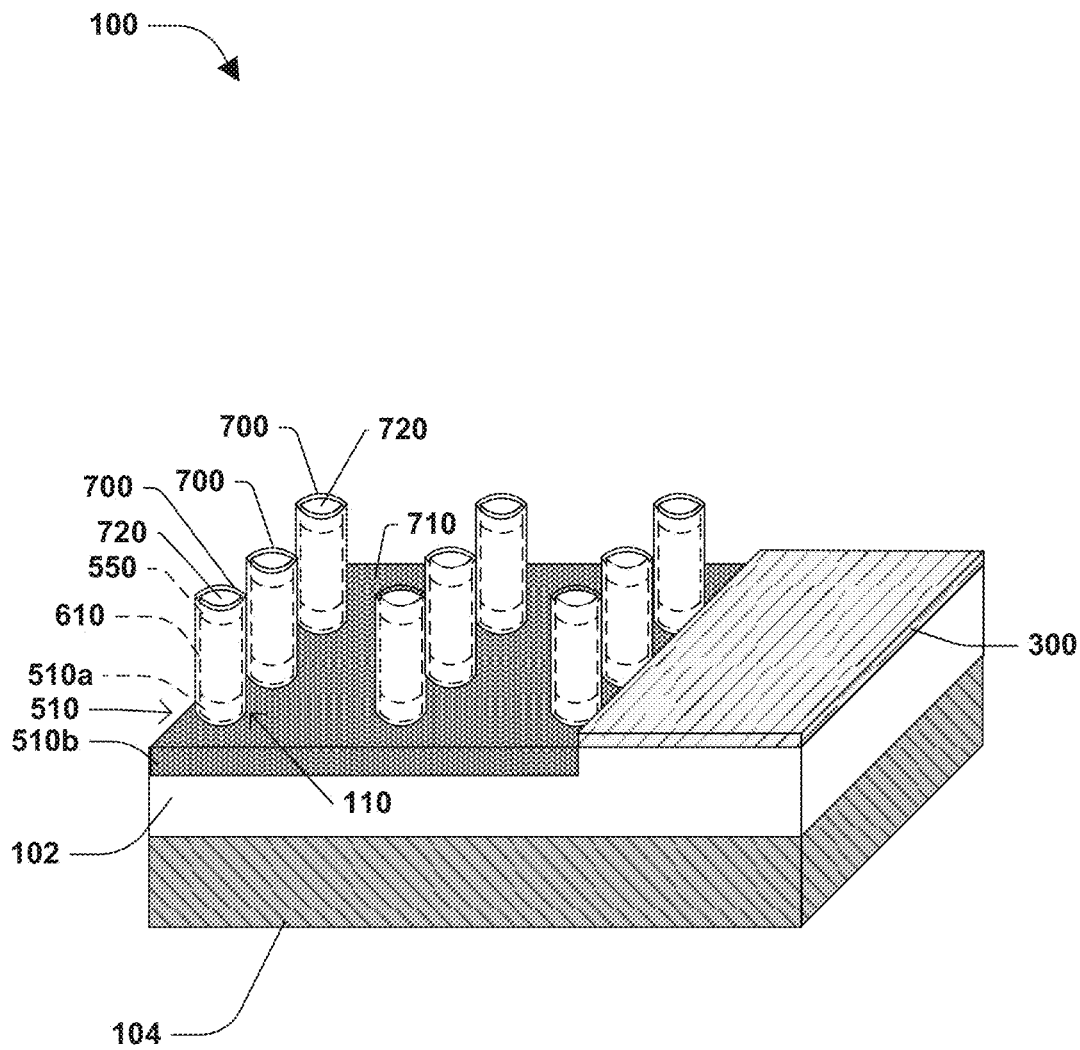
FIG. 7 illustrates a portion of a semiconductor device, according to an embodiment.

Turning to FIG. 7, in an embodiment, one or more spacers 700 are formed surrounding at least one of the first type diffusion region 510a, second type region 550, or channel region 610 of the nanowires 110. In some embodiments, the spacers 700 comprise a dielectric material, such as nitride, oxide, etc., alone or in combination. The spacers 700 are formed in any number of ways, such as by thermal growth, chemical growth, atomic layer deposition (ALD), chemical vapor deposition (CVD), plasma-enhanced chemical vapor deposition (PECVD), or other suitable techniques, for example. In some embodiments, the spacers 700 are etched, such that the isolation region 300, a top surface 720 of the second type region 550, and the first type surface region 510b are substantially not covered by material used to form the spacers 700.

Figure 8:
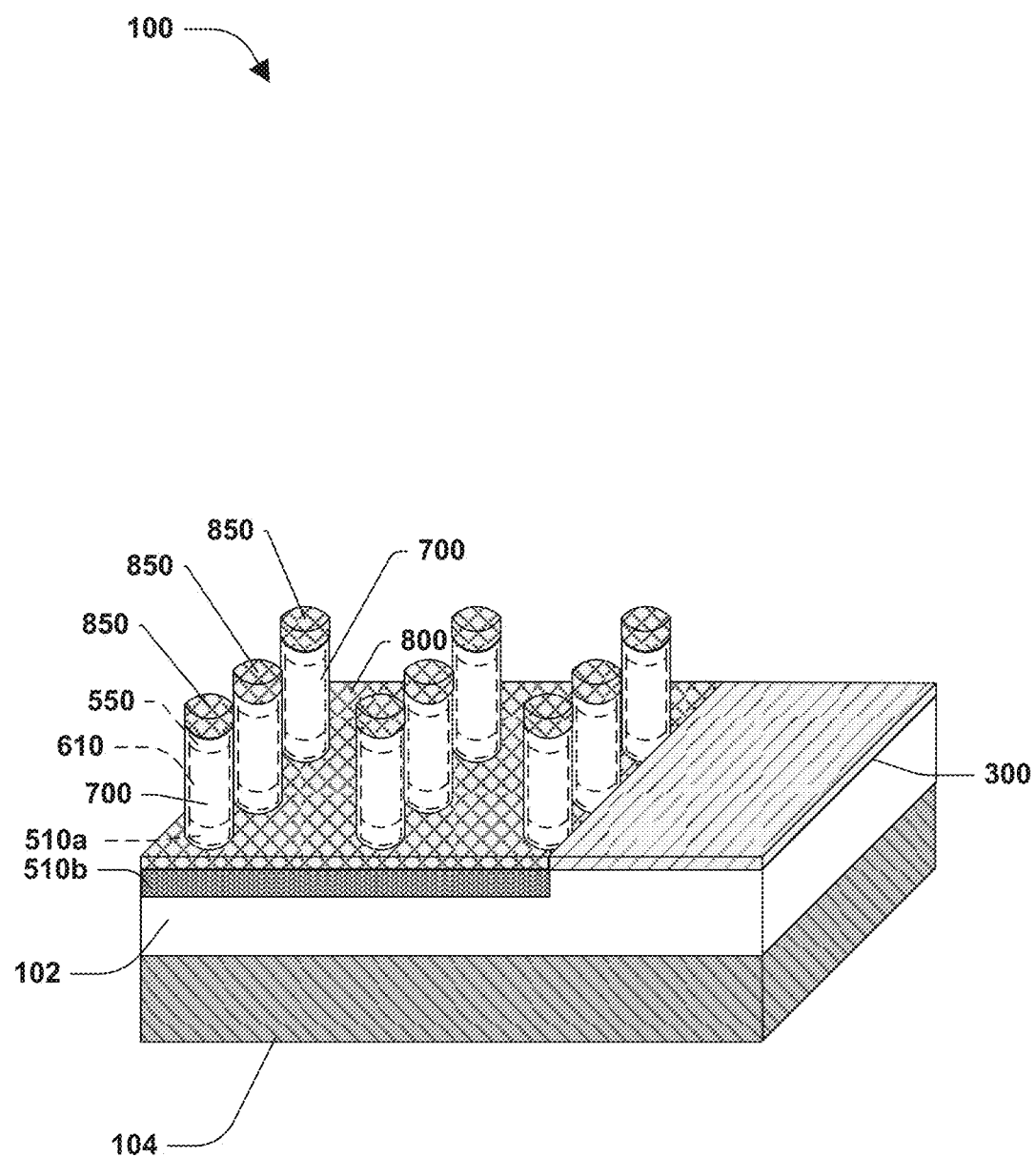
FIG. 8 illustrates forming a first silicide region and a second silicide region associated with forming a semiconductor device, according to an embodiment.

Turning to FIG. 8, in an embodiment, a first silicide region 800 and a second silicide region 850 are formed. The first silicide region 800 and second silicide region 850 are formed in any number of ways, such as by deposition, for example. In some embodiments, the first silicide region 800 is formed on the first type surface region 510b of the first type region 510. In some embodiments, the first silicide region 800 is formed surrounding the spacers 700. In some embodiments, the second silicide region 850 is formed covering the top surface 720 (illustrated in FIG. 7) of the second type region 550.

According to some embodiments, the first silicide region 800 and second silicide region 850 are formed by depositing a layer of metal, such as nickel, platinum, tantalum, titanium, cobalt tungsten, erbium, etc., alone or in combination. In an embodiment, the layer of metal is heated or annealed, such that the layer of metal reacts with silicon in the first type surface region 510b and the second type region 550. In some embodiments, the first silicide region 800 is formed from the reaction between the silicon in the first type surface region 510*b* and the layer of metal. In some embodiments, the second silicide region 850 is formed from the reaction between the silicon in the second type region 550 and the layer of metal. In an embodiment, at least some of the metal that does not react with the silicon is removed, such as by etching.

Figure 9A:
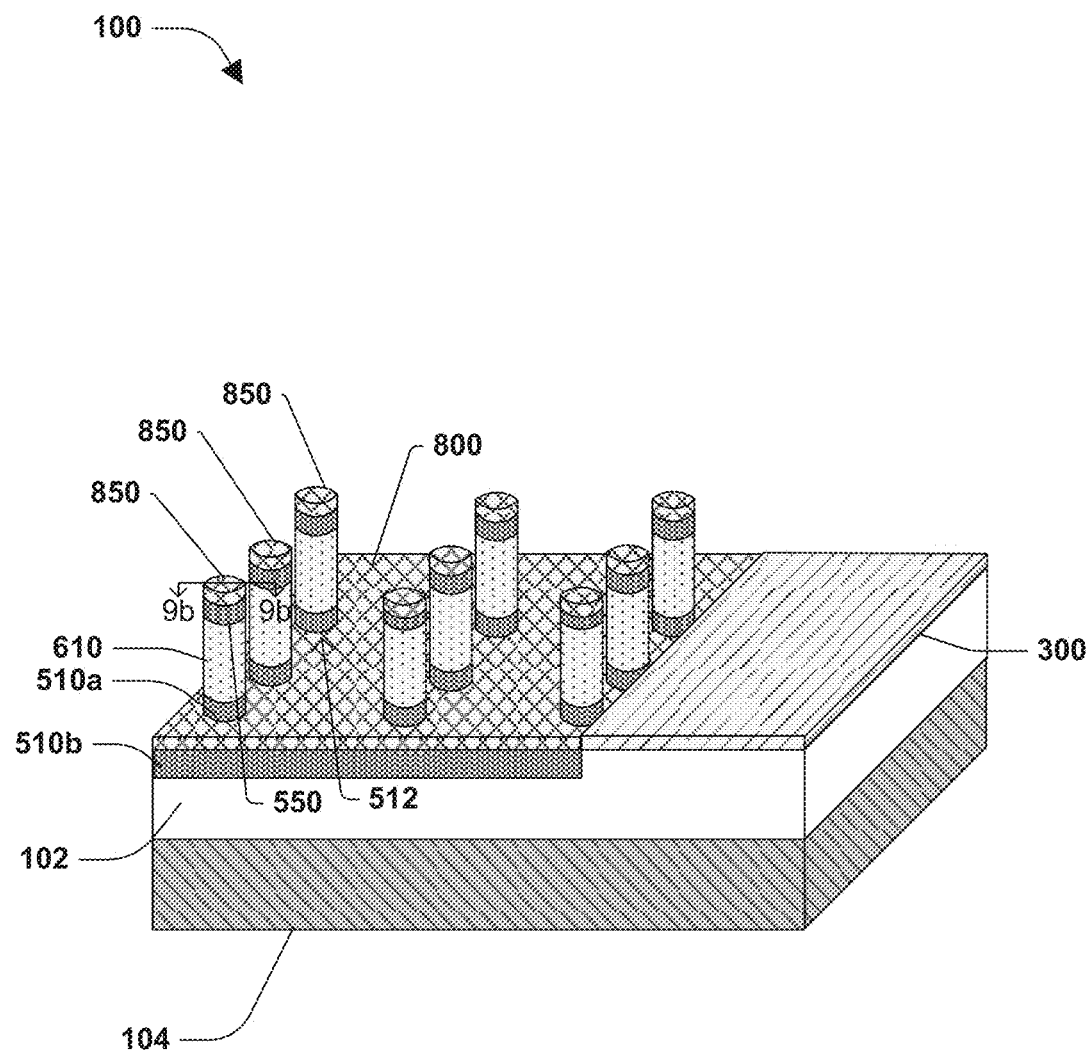
FIG. 9*a* illustrates a portion of a semiconductor device, according to an embodiment.
Figure 9B:
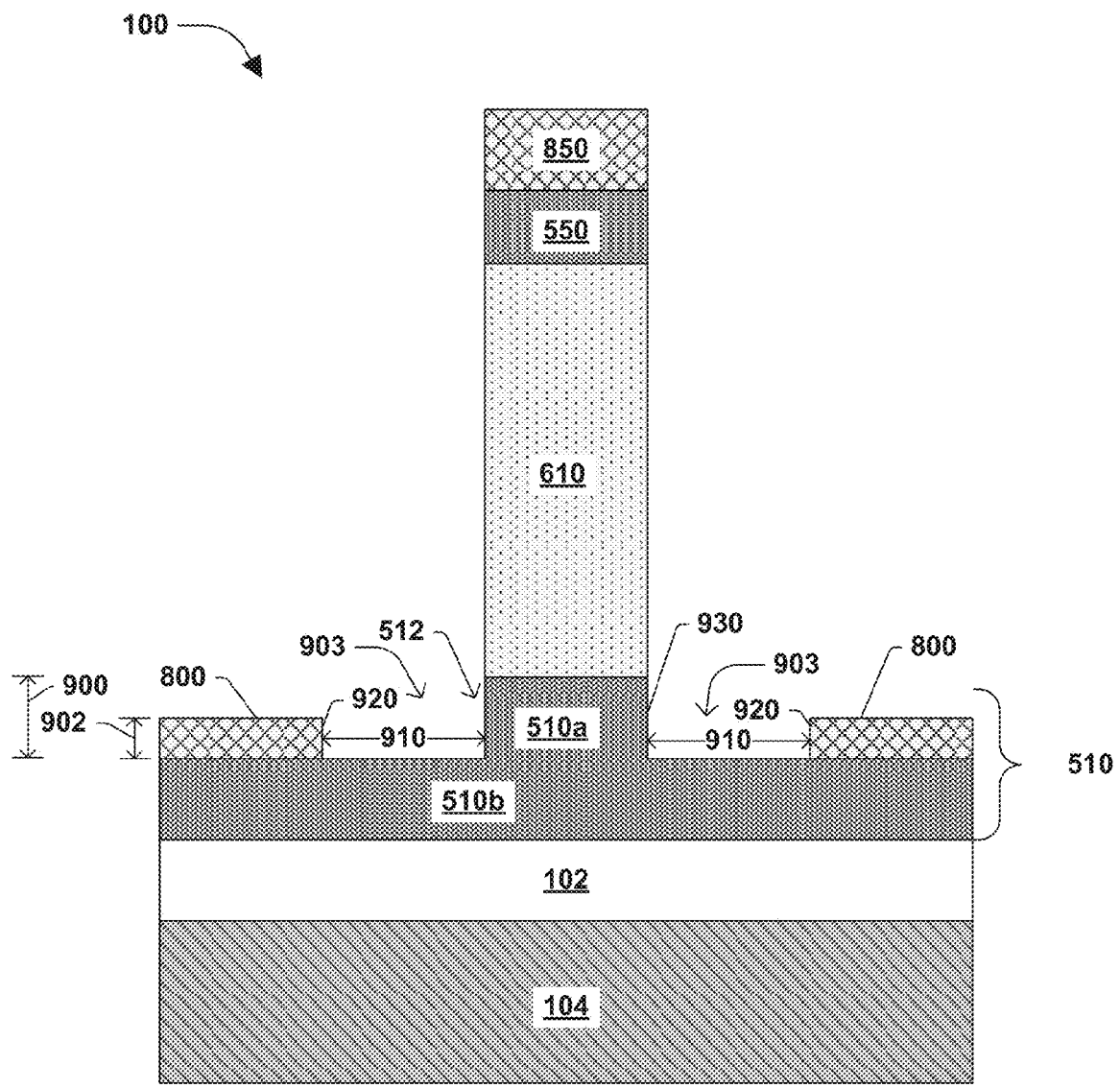
FIG. 9*b* illustrates a portion of a semiconductor device, according to an embodiment.

Turning now to FIGS. 9*a* and 9*b*, in an embodiment, the spacers 700 are removed. FIG. 9*b* is a cross-sectional view of the embodiment of FIG. 9*a* taken along lines 9*b*-9*b* in FIG. 9*a*. The spacers 700 are removed in any number of ways, such as by etching, for example. According to some embodiments, after the spacers 700 are removed, the first type diffusion region 510*a*, second type region 550, and channel region 610 are exposed. According to some embodiments, the first silicide region 800 surrounds at least some of the first type diffusion region 510*a*.

Turning to FIG. 9*b*, in some embodiments, a first type region height 900 of the first type diffusion region 510*a* is greater than a first silicide region height 902 of the first silicide region 800. In some embodiments, after removal of the spacers 700, a first opening 903 is formed between the first silicide region 800 and the first type diffusion region 510*a*. In an embodiment, the first opening 903 surrounds the first type diffusion region 510*a*. In some embodiments, the first silicide region 800 is separated a first distance 910 from the first type diffusion region 510*a* of the first type region 510. According to some embodiments, a first silicide region edge 920 of the first silicide region 800 is separated the first distance 910 from a first type region edge 930 of the first type diffusion region 510*a* of the first type region 510. In an embodiment, the first distance 910 is greater than 0 nm.

Figure 10:
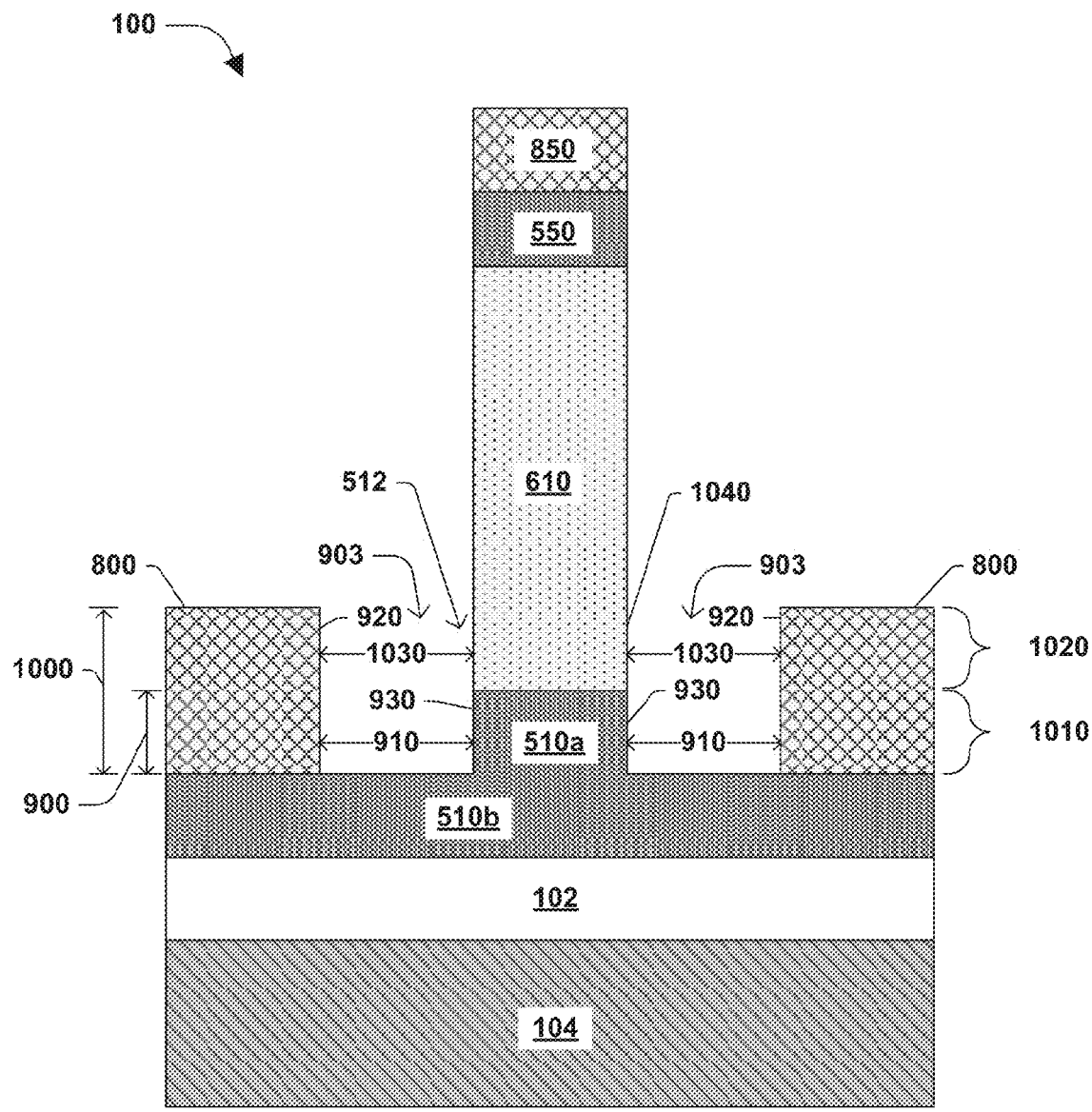
FIG. 10 illustrates a portion of a semiconductor device, according to an embodiment.

Turning now to FIG. 10, in some embodiments, the first type region height 900 of the first type diffusion region 510*a* is less than a first silicide region height 1000 of the first silicide region 800. In an embodiment, the first silicide region 800 surrounds the first type diffusion region 510*a* and at least some of the channel region 610. In some embodiments, after removal of the spacers 700, a bottom portion 1010 of the first silicide region 800 is separated the first distance 910 from the first type diffusion region 510*a*. In some embodiments, a top portion 1020 of the first silicide region 800 is separated a second distance 1030 from the channel region 610. In an embodiment, the first silicide region edge 920 of the first silicide region 800 is separated the second distance 1030 from a channel region edge 1040 of the channel region 610. In an embodiment, the second distance 1030 is greater than 0 nm.

According to some embodiments, the first silicide region 800 is separated at least one of the first distance 910 from the first type diffusion region 510*a* or the second distance 1030 from the channel region 610. According to some embodiments, the first silicide region edge 920 of the first silicide region 800 is separated at least one of the first distance 910 from the first type region edge 930 of the first type diffusion region 510*a* or the second distance 1030 from the channel region edge 1040 of the channel region 610.

Figure 11A:
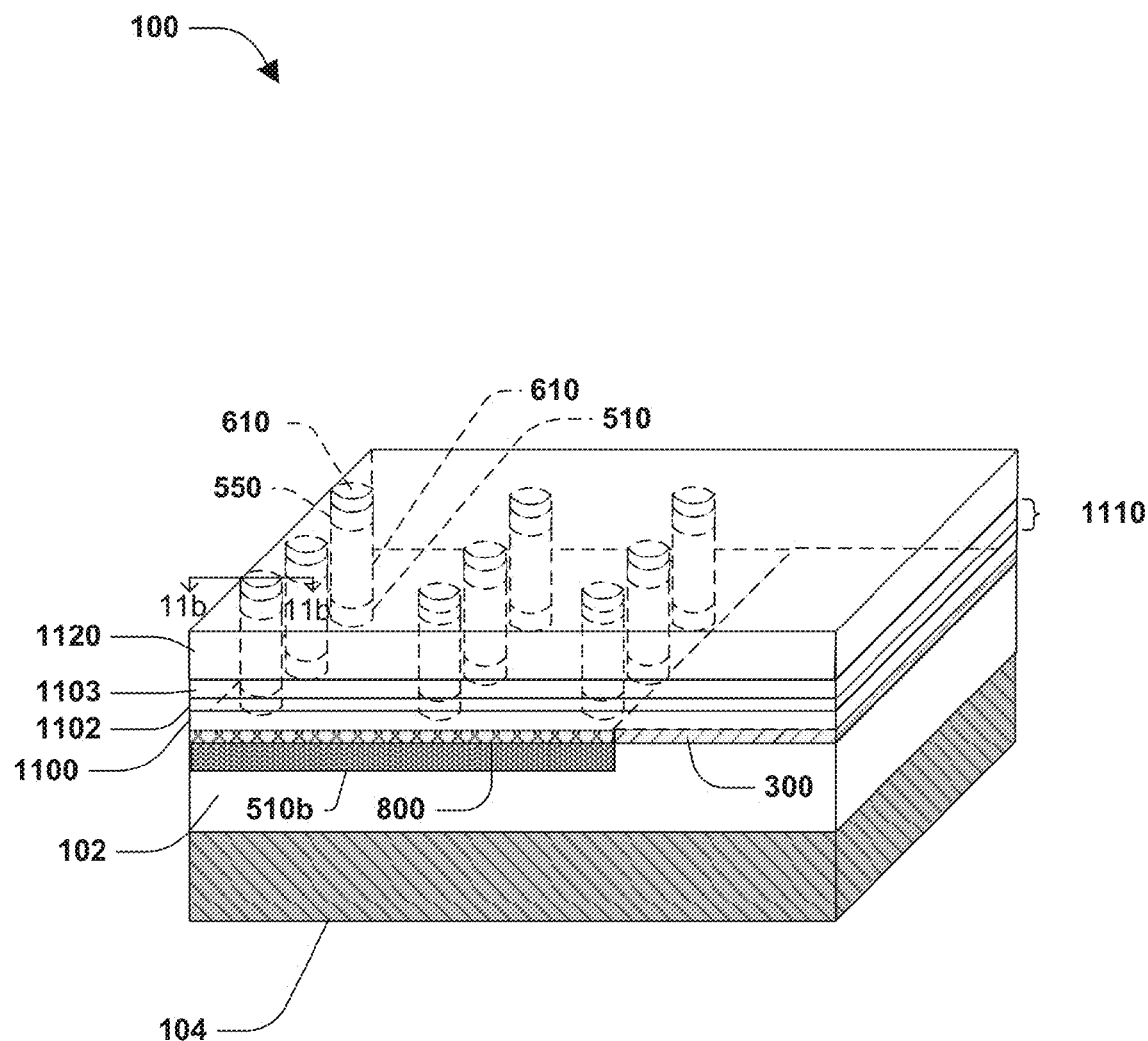
FIG. 11*a* illustrates a semiconductor device, according to an embodiment.
Figure 11B:
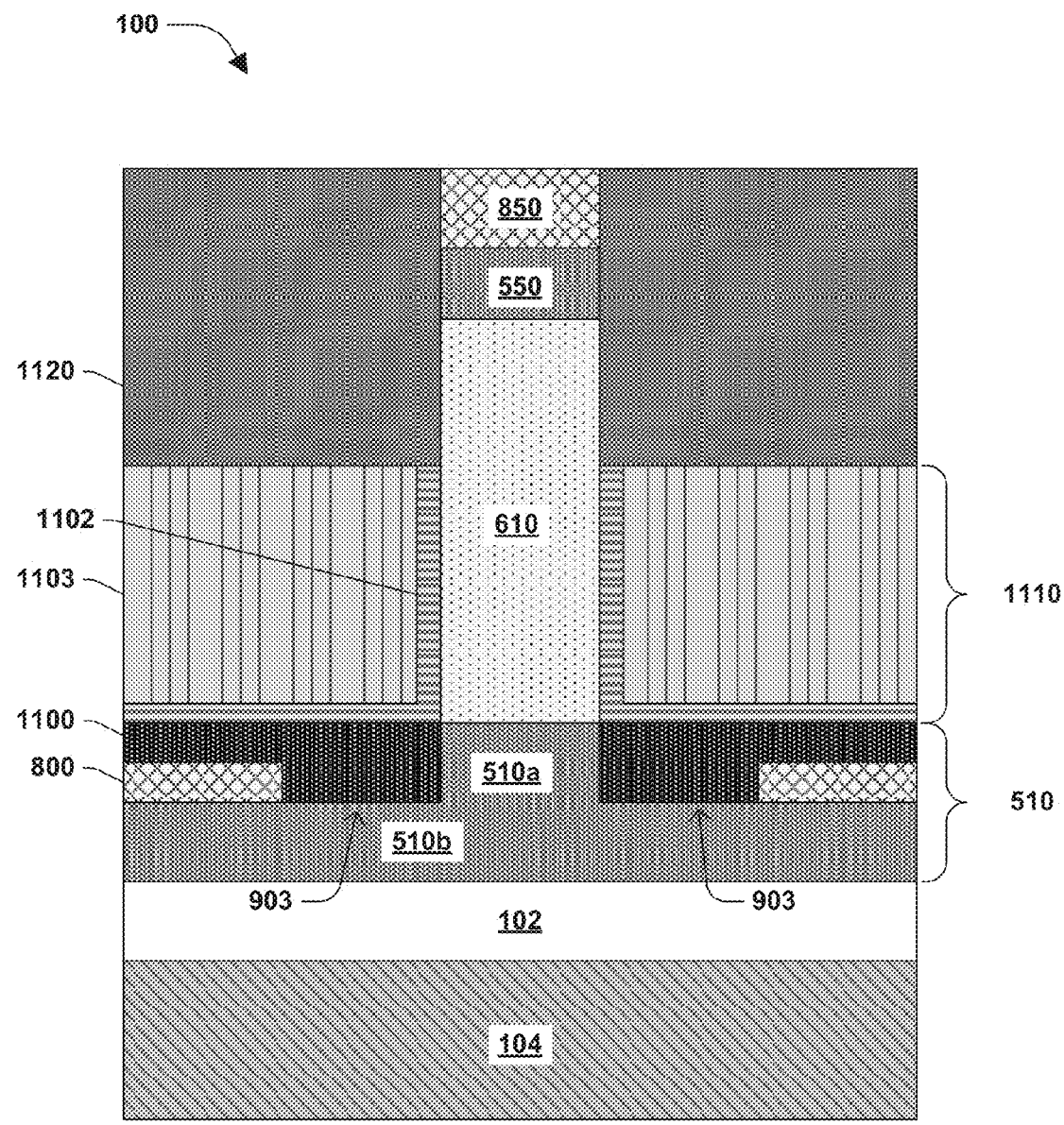
FIG. 11*b* illustrates a semiconductor device, according to an embodiment.

FIG. 11*a* is a perspective view of the semiconductor device 100. FIG. 11*b* is a cross-sectional view of the embodiment of FIG. 11*a* taken along lines 11*b*-11*b* in FIG. 11*a*. In some embodiments, a first gate region 1100 is formed surrounding at least some of the first type diffusion region 510*a*. In some embodiments, the first gate region 1100 is formed over the first silicide region 800 and extends into the first opening 903 between the first type diffusion region 510*a* and the first silicide region 800. In an embodiment, the first gate region 1100 comprises a dielectric material with a relatively high dielectric constant and a metal layer. In some embodiments, the first gate region 1100 comprises a standard dielectric material with a medium or low dielectric constant, such as $SiO_2$. The first gate region 1100 is formed in any number of ways, such as by atomic layer deposition (ALD), chemical vapor deposition (CVD), plasma-enhanced chemical vapor deposition (PECVD), etc.

In some embodiments, a second dielectric region 1102 is formed surrounding the channel region 610. In some embodiments, the second dielectric region 1102 is formed over the first gate region 1100. In an embodiment, the second dielectric region 1102 comprises a dielectric material with a relatively high dielectric constant. In some embodiments, the second dielectric region 1102 comprises a standard dielectric material with a medium dielectric constant, such as $SiO_2$. In some embodiments, the second dielectric region 1102 comprises a standard dielectric material with a medium dielectric constant, such as $SiO_2$ and a dielectric material with a relatively high dielectric constant. The second dielectric region 1102 is formed in any number of ways, such as by atomic layer deposition (ALD), chemical vapor deposition (CVD), physical vapor deposition (PVD), etc.

In some embodiments, a gate electrode 1103 is formed surrounding the second dielectric region 1102 and channel region 610. In some embodiments, the gate electrode 1103 is formed over the second dielectric region 1102. The gate electrode 1103 is formed in any number of ways, such as by atomic layer deposition (ALD), sputtering, thermal evaporation, e-beam evaporation, chemical vapor deposition (CVD), etc., for example. In some embodiments, the gate electrode 1103 includes a conductive material, such as TiN, TaN, TaC, aluminum, copper, polysilicon, etc., alone or in combination. In some embodiments, a gate region 1110 comprises the second dielectric region 1102 and the gate electrode 1103.

In some embodiments, a third dielectric region 1120 is formed surrounding the channel region 610, second type region 550, and second silicide region 850. In some embodiments, the third dielectric region 1120 is formed over the second dielectric region 1102 and gate electrode 1103. In an embodiment, the third dielectric region 1120 comprises a dielectric material with a relatively low dielectric constant. In some embodiments, the third dielectric region 1120 comprises a standard dielectric material with a medium dielectric constant, such as $SiO_2$. The third dielectric region 1120 is formed in any number of ways, such as by atomic layer deposition (ALD), chemical vapor deposition (CVD), plasma-enhanced chemical vapor deposition (PECVD), etc.

According to some embodiments, the semiconductor device 100 includes the first silicide region 800 surrounding the first type diffusion region 510*a*. In some embodiments, the first silicide region 800 is separated at least one of the first distance 910 from the first type diffusion region 510*a* or the second distance 1030 from the channel region 610.

Figure 12:
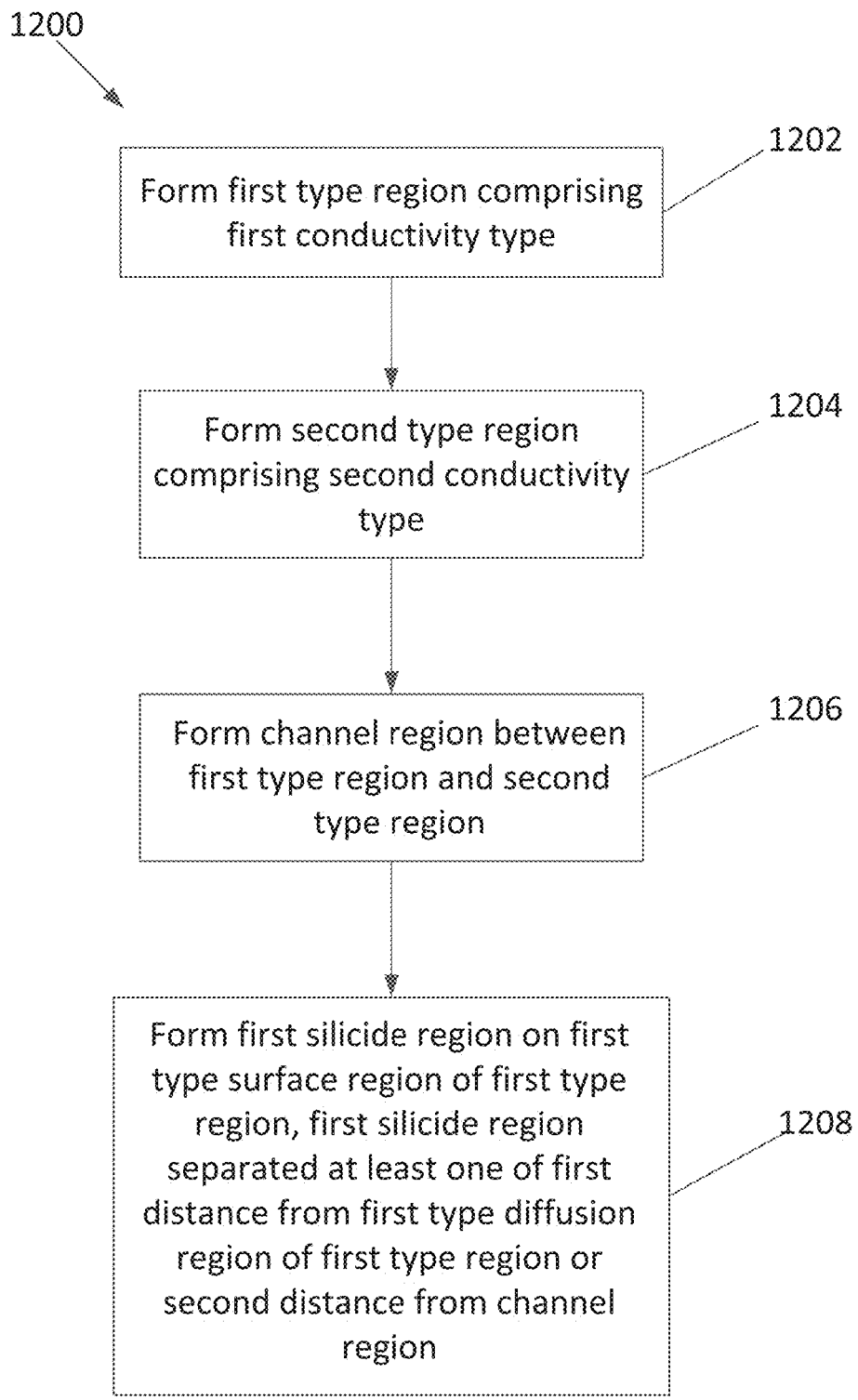
FIG. 12 illustrates a method of forming a semiconductor device, according to an embodiment.

An example method 1200 of forming a semiconductor device, such as semiconductor device 100, according to some embodiments, is illustrated in FIG. 12. At 1202, a first type region 510 is formed comprising a first conductivity type. At 1204, a second type region 550 is formed comprising a second conductivity type. At 1206, a channel region 610 is formed between the first type region 510 and the second type region 550. At 1208, a first silicide region 800 is formed on a first type surface region 510*b* of the first type region, the first silicide region 800 separated at least one of a first distance 910 from the first type diffusion region 510a of the first type region 510 or a second distance 1030 from the channel region 610.

In an embodiment, a semiconductor device comprises a first type region comprising a first conductivity type and a second type region comprising a second conductivity type. In an embodiment, the semiconductor device comprises a channel region extending between the first type region and the second type region. In an embodiment, the semiconductor device comprises a first silicide region on a first type surface region of the first type region. In an embodiment, the first silicide region is separated at least one of a first distance from a first type diffusion region of the first type region or a second distance from the channel region.

In an embodiment, the semiconductor device comprises a first type region comprising a first conductivity type and a second type region comprising a second conductivity type. In an embodiment, the semiconductor device comprises a channel region extending between the first type region and the second type region. In an embodiment, the semiconductor device comprises a first silicide region on a first type surface region of the first type region. In an embodiment, a first silicide region edge of the first silicide region is separated at least one of a first distance from a first type region edge of a first type diffusion region of the first type region or a second distance from a channel region edge of the channel region. In an embodiment, at least one of the first distance is greater than 0 nm or the second distance is greater than 0 nm.

In an embodiment, a method of forming a semiconductor device comprises forming a first type region comprising a first conductivity type. In an embodiment, the method comprises forming a second type region comprising a second conductivity type. In an embodiment, the method comprises forming a channel region between the first type region and the second type region. In an embodiment, the method comprises forming a first silicide region on a first type surface region of the first type region, the first silicide region separated at least one of a first distance from a first type diffusion region of the first type region or a second distance from the channel region.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first type region and a second type region generally correspond to first type region A and second type region B or two different or two identical type regions or the same type region.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device comprising:
   a first type region;
   a second type region;
   a channel region extending between the first type region and the second type region;
   a first silicide region above and in contact with a first type surface region of the first type region, the first silicide region separated at least one of a first distance from a first type diffusion region of the first type region or a second distance from the channel region;
   a dielectric region between the first silicide region and the first type diffusion region and in contact with a sidewall of the first silicide region, the dielectric region overlying the first silicide region; and
   a gate dielectric in contact with the channel region and in contact with the dielectric region, wherein the gate dielectric overlies the first silicide region and the dielectric region is disposed between the first silicide region and the gate dielectric.

2. The semiconductor device of claim 1, wherein the first distance is greater than 0 nm.

3. The semiconductor device of claim 1, wherein the second distance is greater than 0 nm.

4. The semiconductor device of claim 1, wherein the dielectric region is in contact with a sidewall of the first type diffusion region.

5. The semiconductor device of claim 1, wherein the first type region and the second type region have a same conductivity type.

6. The semiconductor device of claim 1, wherein a first type region height of the first type diffusion region is less than a first silicide region height of the first silicide region.

7. The semiconductor device of claim 1, wherein a first type region height of the first type diffusion region is greater than a first silicide region height of the first silicide region.

8. A semiconductor device comprising:
a first type region;
a second type region;
a channel region extending between the first type region and the second type region;
a first silicide region above and in contact with a first type surface region of the first type region, a first silicide region edge of the first silicide region separated at least one of a first distance from a first type region edge of a first type diffusion region of the first type region or a second distance from a channel region edge of the channel region;
a dielectric region between the first silicide region and the first type diffusion region, wherein the dielectric region, the first silicide region, and the first type diffusion region are laterally co-planar; and
a gate dielectric in contact with the channel region and in contact with the dielectric region, wherein the gate dielectric overlies the first silicide region and the dielectric region is disposed between the first silicide region and the gate dielectric.

9. The semiconductor device of claim 8, wherein a first type region height of the first type diffusion region is less than a first silicide region height of the first silicide region.

10. The semiconductor device of claim 8, wherein the dielectric region is in contact with the first type surface region.

11. The semiconductor device of claim 8, comprising a gate electrode overlying the gate dielectric and the first silicide region.

12. The semiconductor device of claim 8, wherein a first type region height of the first type diffusion region is greater than a first silicide region height of the first silicide region.

13. The semiconductor device of claim 8, wherein a second silicide region covers the second type region.

14. The semiconductor device of claim 8, wherein the first type region comprises a source region and the second type region comprises a drain region.

15. The semiconductor device of claim 8, wherein the first type region comprises a drain region and the second type region comprises a source region.

16. The semiconductor device of claim 8, wherein the first type region and the second type region have a same conductivity type.

17. A semiconductor device comprising:
a first type region comprising:
a first type surface region; and
a first type diffusion region;
a second type region;
a channel region extending between the first type region and the second type region;
a first silicide region above and in contact with the first type surface region;
a dielectric region above and in contact with the first type surface region and overlying the first silicide region, the dielectric region disposed between and in contact with the first silicide region and the first type diffusion region; and
a gate dielectric in contact with the channel region and in contact with the dielectric region, wherein the gate dielectric overlies the first silicide region and the dielectric region is disposed between the first silicide region and the gate dielectric.

18. The semiconductor device of claim 17, wherein the dielectric region is disposed around a circumference of the first type diffusion region.

19. The semiconductor device of claim 17, wherein the first type region and the second type region have a same conductivity type.

20. The semiconductor device of claim 17, comprising a gate electrode overlying the gate dielectric, the dielectric region, and the first silicide region.

* * * * *